(12) United States Patent
Pandev

(10) Patent No.: US 9,721,055 B2
(45) Date of Patent: *Aug. 1, 2017

(54) MEASUREMENT MODEL OPTIMIZATION BASED ON PARAMETER VARIATIONS ACROSS A WAFER

(71) Applicant: KLA-Tencor Corporation, Milpitas, CA (US)

(72) Inventor: Stilian Ivanov Pandev, Santa Clara, CA (US)

(73) Assignee: KLA-Tencor Corporation, Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/478,746

(22) Filed: Sep. 5, 2014

(65) Prior Publication Data

US 2014/0379281 A1 Dec. 25, 2014

Related U.S. Application Data

(63) Continuation of application No. 13/887,357, filed on May 5, 2013, now Pat. No. 8,843,875.

(Continued)

(51) Int. Cl.
*G01B 5/28* (2006.01)
*G06F 17/50* (2006.01)
*H01L 21/66* (2006.01)

(52) U.S. Cl.
CPC .......... *G06F 17/5081* (2013.01); *H01L 22/12* (2013.01); *H01L 22/20* (2013.01); *H01L 2924/0002* (2013.01)

(58) Field of Classification Search
CPC ......... H01L 2924/0002; H01L 2924/00; H01L 22/12; H01L 22/20; G03F 1/84; G06F 17/5081; G03B 27/72; B82Y 40/00
See application file for complete search history.

(56) References Cited

U.S. PATENT DOCUMENTS 7,266,800 B2 9/2007 Sezginer
8,175,831 B2 * 5/2012 Izikson ............... G05B 21/02
356/237.4

(Continued)

FOREIGN PATENT DOCUMENTS

CN 101802829 A 8/2010
CN 102054092 A 5/2011
KR 100567625 B1 4/2006

OTHER PUBLICATIONS

International Search Report and Written Opinion mailed on Sep. 24, 2013, for PCT Application No. PCT/US2013/040001 filed on May 7, 2013, by KLA-Tencor Corporation, 11 pages.

*Primary Examiner* — Elias Desta
(74) *Attorney, Agent, or Firm* — Spano Law Group; Joseph S. Spano

(57) ABSTRACT

An optimized measurement model is determined based a model of parameter variations across a semiconductor wafer. A global, cross-wafer model characterizes a structural parameter as a function of location on the wafer. A measurement model is optimized by constraining the measurement model with the cross-wafer model of process variations. In some examples, the cross-wafer model is itself a parameterized model. However, the cross-wafer model characterizes the values of a structural parameter at any location on the wafer with far fewer parameters than a measurement model that treats the structural parameter as unknown at every location. In some examples, the cross-wafer model gives rise to constraints among unknown structural parameter values based on location on the wafer. In one example, the cross-wafer model relates the values of structural parameters associated with groups of measurement sites based on their location on the wafer.

20 Claims, 4 Drawing Sheets

Related U.S. Application Data

(60) Provisional application No. 61/644,030, filed on May 8, 2012.

(56) References Cited

U.S. PATENT DOCUMENTS

| | | |
|---|---|---|
| 2005/0132306 A1 | 6/2005 | Smith et al. |
| 2006/0167651 A1 | 7/2006 | Zangooie et al. |
| 2007/0135959 A1 | 6/2007 | Vuong et al. |
| 2008/0183442 A1 | 7/2008 | Loo et al. |
| 2008/0195983 A1 | 8/2008 | Chidambarrao et al. |
| 2009/0238441 A1 | 9/2009 | Yamashita |
| 2010/0086196 A1 | 4/2010 | Li et al. |
| 2011/0099526 A1 | 4/2011 | Liu |

* cited by examiner

US 9,721,055 B2

MEASUREMENT MODEL OPTIMIZATION BASED ON PARAMETER VARIATIONS ACROSS A WAFER

CROSS REFERENCE TO RELATED APPLICATION

The present application for patent is a continuation of, and claims priority under 35 U.S.C. §120 from, U.S. patent application Ser. No. 13/887,357, entitled "Measurement Model Optimization Based on Parameter Variations Across A Wafer," filed May 5, 2013, which, in turn claims priority under 35 U.S.C. §119 from U.S. provisional patent application Ser. No. 61/644,030, entitled "Process Based Cross Wafer Model Optimization," filed May 8, 2012, the subject matter of which are incorporated herein by reference in their entireties.

TECHNICAL FIELD

The described embodiments relate to metrology systems and methods, and more particularly to methods and systems for improved measurement of structural parameters.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition and other parameters of nanoscale structures.

Traditionally, optical metrology is performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty.

For example, modern memory structures are often high-aspect ratio, three-dimensional structures that make it difficult for optical radiation to penetrate to the bottom layers. In addition, the increasing number of parameters required to characterize complex structures (e.g., FinFETs), leads to increasing parameter correlation. As a result, the measurement model parameters characterizing the target often cannot be reliably decoupled.

In response to these challenges, more complex optical tools have been developed. Measurements are performed over a large ranges of several machine parameters (e.g., wavelength, azimuth and angle of incidence, etc.), and often simultaneously. As a result, the measurement time, computation time, and the overall time to generate reliable results, including measurement recipes, increases significantly. In addition, the spreading of light intensity over large wavelength ranges decreases illumination intensity at any particular wavelength and increases signal uncertainty of measurements performed at that wavelength.

Future metrology applications present challenges for metrology due to increasingly small resolution requirements, multi-parameter correlation, increasingly complex geometric structures, and increasing use of opaque materials. Thus, methods and systems for improved measurements are desired.

SUMMARY

Methods and systems for generating optimized measurement models for metrology systems configured to measure structural and material characteristics associated with different semiconductor fabrication processes are presented.

In one aspect, an optimized measurement model is determined based on modeling of parameter variations across a semiconductor wafer. Variations of one or more specimen parameters are modeled globally (i.e., across the surface of the wafer). The measurement model definition is improved by constraining the measurement model with a cross-wafer model of process variations.

In many embodiments, process induced variations appear as spatial patterns across the wafer (e.g., radially symmetric thin film thickness patterns with a U or W shape). These patterns generally result from smooth and continuous parameter changes across the wafer. The cross-wafer model characterizes a specimen parameter value as a function of location on the wafer.

In some examples, the cross-wafer model is itself a parameterized model, but with far fewer parameters than a measurement model that treats the specimen parameter as a different unknown at every location.

In some examples, the cross-wafer model gives rise to constraints on the relationships among unknown specimen parameters based on location on the wafer. In this manner the cross-wafer model gives rise to functional relationships between specimen parameters associated with groups of measurement sites based on their location on the wafer.

The measurement model is constrained by the cross-wafer model of parameter variations. In this manner, the set of parameters that must be fitted to arrive at a measurement solution is reduced. This results in less correlation among parameters, more accurate measurement results, and less computation time for library generation, fitting, and analysis. For example, correlation between the thickness of layers and a grating structure fabricated on top of the layers is eliminated or significantly reduced. Accuracy is improved because the modeled parameters are floated and constrained across the wafer instead of fixed to some nominal value. In some examples, the optimized measurement model enables measurements with fewer measurement technologies and reduced range of illumination wavelengths to achieve satisfactory measurement results. In some examples, measurement systems employing high intensity light sources within limited wavelength ranges is enabled by the optimized measurement model.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1:
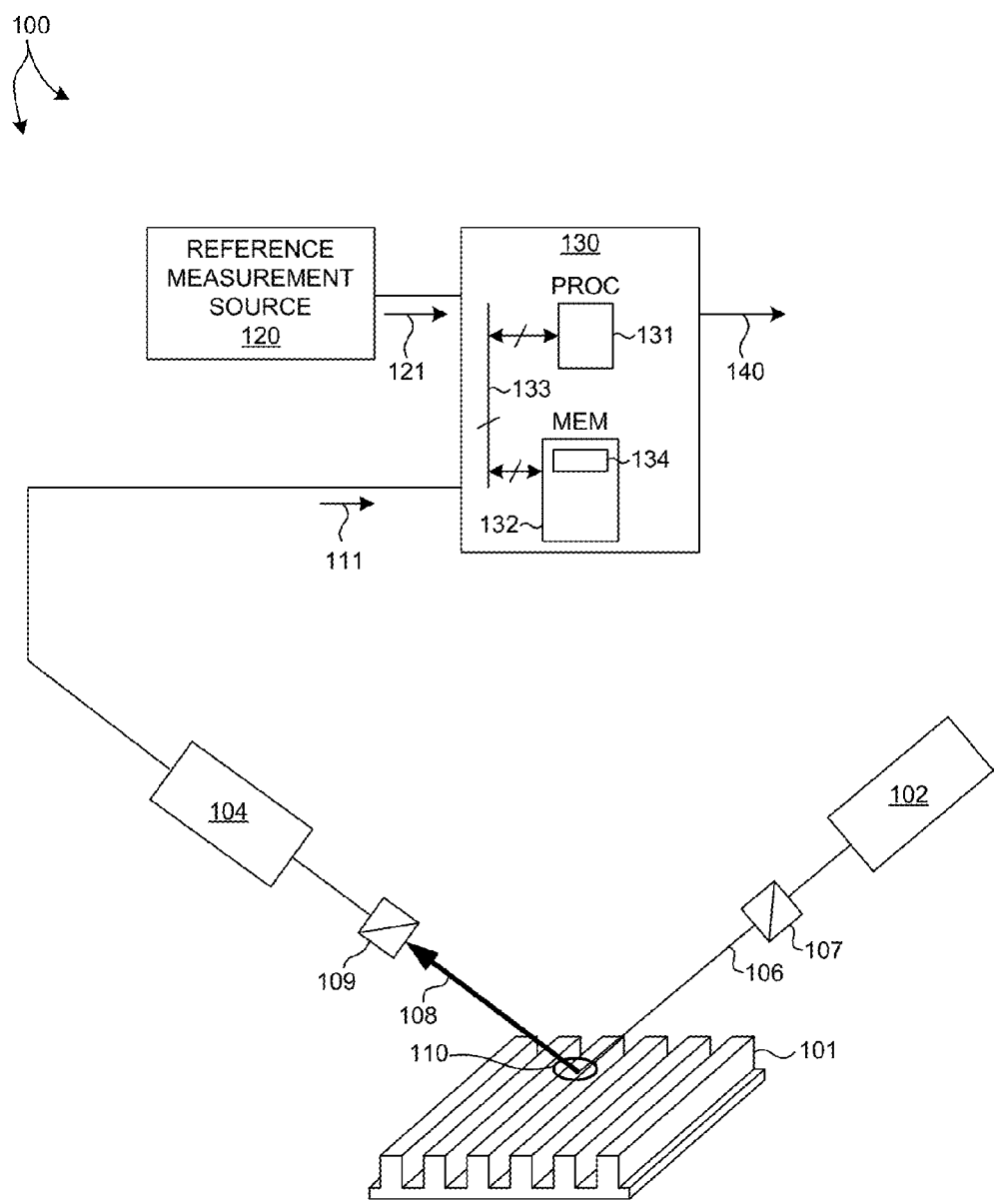
FIG. 1 is a diagram illustrative of a metrology system 100 configured to optimize a measurement model based on a cross-wafer model of process variation in accordance with the methods described herein.

Reference will now be made in detail to background examples and some embodiments of the invention, examples of which are illustrated in the accompanying drawings. Methods and systems for optimizing measurement models based on modeling of parameter variations across a semiconductor wafer are presented. Systems employing optimized measurement models are used to measure structural and material characteristics (e.g., material composition, dimensional characteristics of structures and films, etc.) associated with different semiconductor fabrication processes.

In general, optical metrology techniques discussed herein are indirect methods of measuring physical properties of a specimen under inspection. In most cases, the measured values cannot be used to directly determine the physical properties of the specimen. The nominal measurement process consists of parameterization of the structure (e.g., film thicknesses, critical dimensions, etc.) and the machine (e.g., wavelengths, angles of incidence, polarization angles, etc.). A measurement model is created that attempts to predict the measured values. The model includes parameters associated with the machine ($P_{machine}$) and the specimen ($P_{specimen}$).

Machine parameters are parameters used to characterize the metrology tool itself. Exemplary machine parameters include angle of incidence (AOI), analyzer angle ($A_0$), polarizer angle ($P_0$), illumination wavelength, numerical aperture (NA), etc. Specimen parameters are parameters used to characterize the specimen. For a thin film specimen, exemplary specimen parameters include refractive index, dielectric function tensor, nominal layer thickness of all layers, layer sequence, etc. For measurement purposes, the machine parameters are treated as known, fixed parameters and the specimen parameters, or a subset of specimen parameters, are treated as unknown, floating parameters. The floating parameters are resolved by a fitting process (e.g., regression, library matching, etc.) that produces the best fit between theoretical predictions and experimental data. The unknown specimen parameters, $P_{specimen}$, are varied and the model output values are calculated until a set of specimen parameter values are determined that results in a close match between the model output values and the experimentally measured values.

In many cases, the specimen parameters are highly correlated. This can lead to model instability. In some cases, this is resolved by fixing certain specimen parameters. However, this often results in significant errors in the estimation of the remaining parameters. For example, underlying layers (e.g., oxide base layers of a semiconductor material stack on a semiconductor wafer) are not uniformly thick over the surface of a wafer. However, to reduce parameter correlation, measurement models are constructed that treat these layers as having a fixed thickness over the surface of the wafer. Unfortunately, this may lead to significant errors in the estimation of other parameters.

Parameter correlations may also be reduced by incorporating additional geometric information characterizing a single target or multiple targets in close proximity, but this geometric information is location specific, and must be separately incorporated for each location. Process variation information collected from multiple locations on the wafer may also be incorporated into the measurement model to reduce parameter correlations. However, similarly, this process variation information is location specific and must be separately incorporated for each location.

In one aspect, an optimized measurement model is determined based on modeling of parameter variations across a semiconductor wafer. Variations of one or more specimen parameters are modeled globally (i.e., across the surface of the wafer). Hence the model of parameter variations across the semiconductor wafer is a cross-wafer model. The measurement model definition is improved by constraining the measurement model with a cross-wafer model of process variations.

In many embodiments, process induced variations appear as spatial patterns across the wafer (e.g., radially symmetric thin film thickness patterns with a U or W shape). These patterns generally result from smooth and continuous parameter changes across the wafer that are readily captured by a cross-wafer model. The cross-wafer model characterizes a specimen parameter value as a function of location on the wafer. In some examples, the cross-wafer model is itself a parameterized model, but with far fewer parameters than a measurement model that treats the specimen parameter as a different unknown at every location. In some examples, the cross-wafer model gives rise to constraints on the relationships among unknown specimen parameters based on location on the wafer. In this manner the cross-wafer model gives rise to functional relationships between specimen parameters associated with groups of measurement sites based on their location on the wafer.

The measurement model is constrained by the cross-wafer model of parameter variations. In this manner, the set of parameters that must be fitted to arrive at a measurement solution is reduced. This results in less correlation among parameters, more accurate measurement results, and less computation time for library generation, fitting, and analysis. For example, correlation between the thickness of layers and a grating structure fabricated on top of the layers is eliminated or significantly reduced. Accuracy is improved because the modeled parameters are floated and constrained across the wafer instead of fixed to some nominal value. In some examples, the optimized measurement model enables measurements with fewer measurement technologies and reduced range of illumination wavelengths to achieve satisfactory measurement results. In some examples, measurement systems employing high intensity light sources within limited wavelength ranges is enabled by the optimized measurement model.

FIG. 1 illustrates a system 100 for measuring characteristics of a specimen in accordance with the exemplary methods presented herein. As shown in FIG. 1, the system 100 may be used to perform spectroscopic ellipsometry measurements of one or more structures of a specimen 101. In this aspect, the system 100 may include a spectroscopic ellipsometer equipped with an illuminator 102 and a spectrometer 104. The illuminator 102 of the system 100 is configured to generate and direct illumination of a selected wavelength range (e.g., 150-850 nm) to the structure disposed on the surface of the specimen 101. In turn, the spectrometer 104 is configured to receive illumination reflected from the surface of the specimen 101. It is further noted that the light emerging from the illuminator 102 is polarized using a polarization state generator 107 to produce a polarized illumination beam 106. The radiation reflected by the structure disposed on the specimen 101 is passed through a polarization state analyzer 109 and to the spectrometer 104. The radiation received by the spectrometer 104 in the collection beam 108 is analyzed with regard to polarization state, allowing for spectral analysis by the spectrometer of radiation passed by the analyzer. These spectra 111 are passed to the computing system 130 for analysis of the structure.

As depicted in FIG. 1, system 100 includes a single measurement technology (i.e., SE). However, in general, system 100 may include any number of different measurement technologies. By way of non-limiting example, system 100 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, rather than one tool integrating multiple technologies.

In a further embodiment, system 100 may include one or more computing systems 130 employed to generate an optimized measurement model based on constraints introduced by a cross-wafer model of parameter variations in accordance with the methods described herein. The one or more computing systems 130 may be communicatively coupled to the spectrometer 104. In one aspect, the one or more computing systems 130 are configured to receive measurement data 111 associated with measurements of the structure of specimen 101.

In addition, in some embodiments, the one or more computing systems 130 are further configured to receive a set of reference measurement data 121 associated with a measurement of the specimen 101 by a reference measurement source 120. In some examples, the reference measurement data 121 is stored in memory (e.g., memory 132) and retrieved by computing system 130.

In a further embodiment, the one or more computing systems 130 are configured to access model parameters in real-time, employing Real Time Critical Dimensioning (RTCD), or it may access libraries of pre-computed models for determining an optimized measurement model in accordance with the methods described herein.

It should be recognized that the various steps described throughout the present disclosure may be carried out by a single computer system 130 or, alternatively, a multiple computer system 130. Moreover, different subsystems of the system 100, such as the spectroscopic ellipsometer 104, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the spectrometer 104 in any manner known in the art. For example, the one or more computing systems 130 may be coupled to computing systems associated with the spectrometer 104. In another example, the spectrometer 104 may be controlled directly by a single computer system coupled to computer system 130.

The computer system 130 of the metrology system 100 may be configured to receive and/or acquire data or information from the subsystems of the system (e.g., spectrometer 104, reference measurement source 120, and the like) by a transmission medium that may include wireline and/or wireless portions. In this manner, the transmission medium may serve as a data link between the computer system 130 and other subsystems of the system 100.

Computer system 130 of the integrated metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, reference measurement source 120, or other external systems). For example, the computing system 130 may be configured to receive measurement data from a storage medium (i.e., memory 132 or an external memory) via a data link. For instance, spectral results obtained using spectrometer 104 may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, an optimized measurement model or a specimen parameter 140 determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 2:
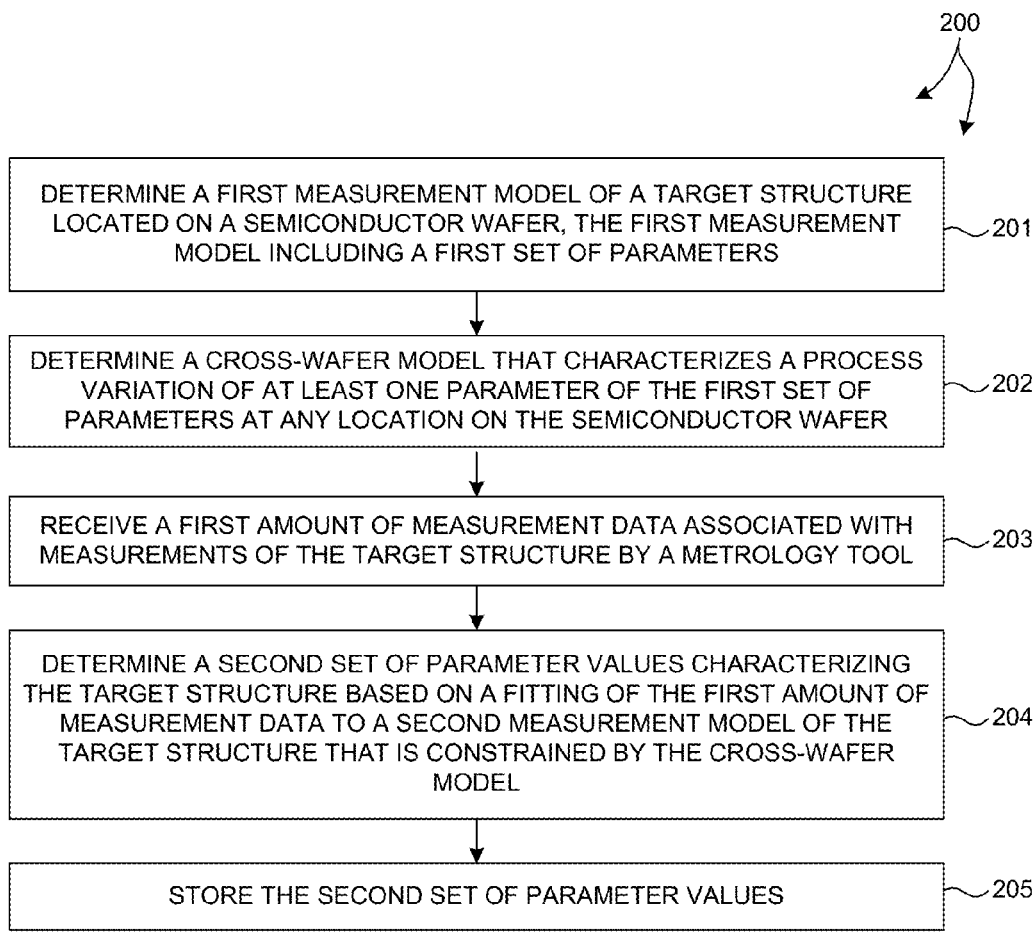
FIG. 2 is a flowchart illustrative of an exemplary method 200 of optimizing a measurement model based on a cross-wafer model of process variation.

FIG. 2 illustrates a method 200 suitable for implementation by the metrology system 100 of the present invention. In one aspect, it is recognized that data processing blocks of method 200 may be carried out via a pre-programmed algorithm executed by one or more processors of computing system 130. While the following description is presented in the context of metrology system 100, it is recognized herein that the particular structural aspects of metrology system 100 do not represent limitations and should be interpreted as illustrative only.

In block 201, a first measurement model of a target structure located on a semiconductor wafer is determined. The first measurement model includes a first set of parameters. The parameters may include geometric parameters, material parameters, and other parameters. Such measurement models may be generated by computing system 130 using a modeling and library-generation package such as AcuShape™, available from KLA-Tencor, Corp., San Jose, Calif.

In block 202, a cross-wafer model that characterizes a process variation of at least one parameter of the first set of parameters at any location on the semiconductor wafer is determined. The cross-wafer model characterizes a process variation of at least one parameter used to describe the structure being measured. The parameter is dependent on the location of the target structure on the semiconductor wafer, and the cross-wafer model describes this dependency.

The cross-wafer model may be determined from process variation data generated from a variety of sources. In some embodiments, process variation data is generated from actual process data, such as data physically measured in a physical process flow (e.g., measurements taken at any point in a semiconductor wafer fabrication process flow). For example, process variation data may be generated based on measurements performed by a reference measurement source 120. In some embodiments, a reference measurement source 120 is another metrology tool capable of highly accurate measurements of a target structure (e.g., TEM, SEM, X-Ray scatterometer, etc.). In some other examples, process variation data may be generated based on measurements performed by system 100 using the first measurement model fitted to measurement data collected using a different set of measurement technologies and machine parameter values.

In some other embodiments, process variation data is model based. For example, a process simulator (e.g., PROLITH™ simulator available from KLA-Tencor, Corp., San Jose, Calif.) may be employed to simulate changes in a target structure based on variations within a process window to generate process variation data.

In some other examples, process variation data is defined by the user. For example, process variation data may be described by equations defining relationships among parameters. In another example, process variation data may be described by one or more correlation matrices defining relationships among parameters. In another example, process variation data may be defined by selecting a set of expected profiles.

The process variation data defines, or is used to define, the cross-wafer model that constrains parameters of the first measurement model. Exemplary parameters include bottom critical dimension (BCD), top critical dimension (TCD), middle critical dimension (MCD), sidewall angle (SWA), film thickness, etc.

Figure 3:
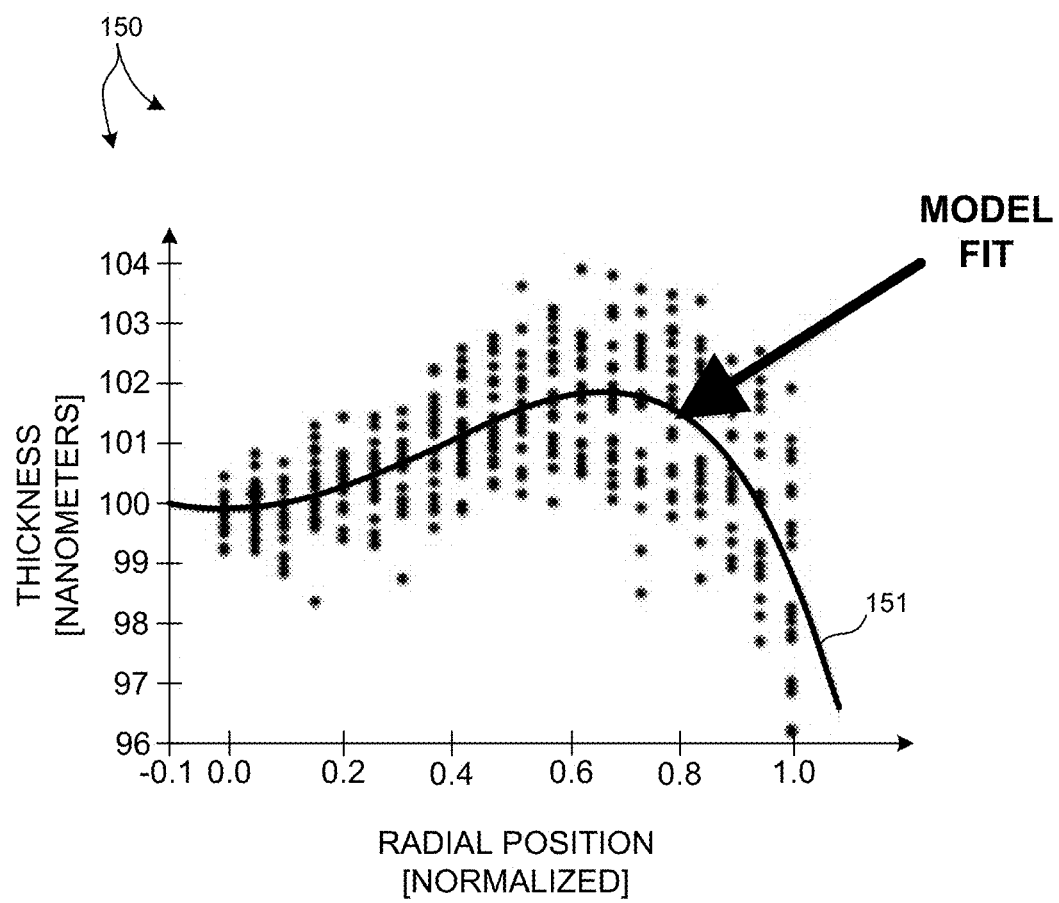
FIG. 3 is a plot 150 depicting measurements of a film thickness for different radial locations on a wafer.

As discussed hereinbefore, in many embodiments, process induced variations appear as spatial patterns across the wafer. FIG. 3 is a plot 150 illustrative of measurements of a film thickness at a number of different radial positions on a wafer. As illustrated in FIG. 3, the film thickness varies significantly across the wafer in a distinct spatial pattern. A cross-wafer model describing the film thickness as a function of position on the wafer is developed. In the depicted example, a polynomial function described by equation (1) is a cross-wafer model describing the film thickness as a function of radial position on the wafer where, R, is the distance from the center of the wafer, H, is the film thickness, and $B_0$, $B_1$ and $B_2$ are polynomial coefficients.

$$H = B_0 - B_1 R^4 + B_2 R^2 \qquad (1)$$

In some examples, the cross-wafer model is fit to the film thickness measurement data to arrive at a cross-wafer model that characterizes the film thickness as a function of location on the wafer. In this example, the cross-wafer model defines the film thickness as a function of radial position, R. An exemplary model fit is illustrated by plotline 151 in FIG. 3.

In some examples, the fitting of the cross-wafer model is performed based on reference measurement data (e.g., measurement data 121 received from a reference measurement source 120, measurement data 111 generated by the metrology system 100, or data generated by predefined process specific models). After fitting the parameters of the cross-wafer model (e.g., $B_0$, $B_1$, and $B_2$), the film thickness value is calculated for a particular location and treated as a constant in a subsequent measurement analysis involving measurement data collected at that particular location.

In some other examples, rather than constraining a measurement model by specific values generated by the cross-wafer model, the parameterized cross-wafer model itself is used to constrain the measurement model. For example, equation (1) can be used to constrain the measurement model. In this manner, the characterization of film thickness by the measurement model is dependent on only three parameters ($B_0$, $B_1$, and $B_2$), rather than floating the parameter for every location on a wafer. In these examples, the cross-wafer model is itself a parameterized model, but with far fewer parameters than a measurement model that treats the specimen parameter as a different unknown at every location. In these examples, the parameters of the cross-wafer model (e.g., $B_0$, $B_1$, and $B_2$) are floated in a subsequent measurement analysis. In many cases, the values of a specimen parameter (e.g., film thickness) vary from wafer to wafer. A measurement model that floats the parameters of the cross-wafer model is able to accommodate wafer to wafer variations in the specimen parameter (e.g., film thickness) directly by measurement analysis associated with each wafer, rather than having to generate explicit feedforward values for subsequent analysis of each wafer.

In some examples, the cross-wafer model gives rise to constraints on the values of unknown specimen parameters based on location on the wafer. In this manner the cross-wafer model gives rise to functional relationships between specimen parameters associated with groups of measurement sites based on their location on the wafer.

Figure 4:
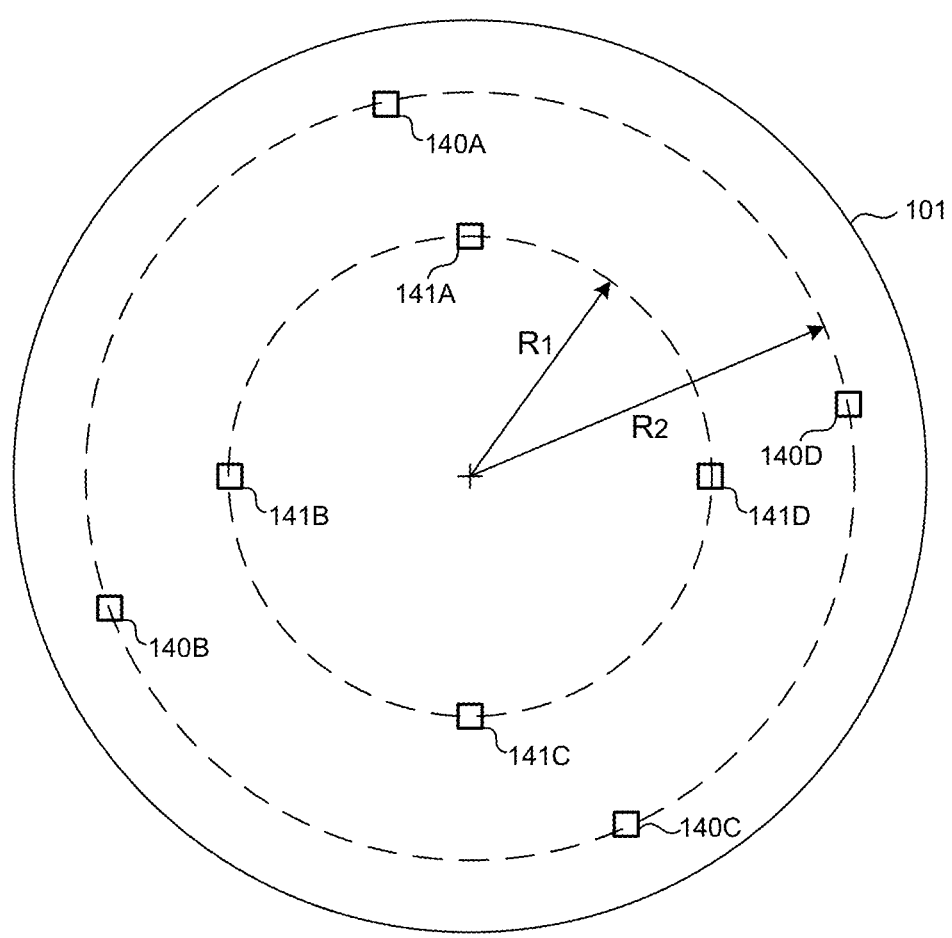
FIG. 4 is a diagram illustrative of groups of measurement sites having the same radial location on a wafer 101.

In one example, a cross-wafer model characterizing a film thickness parameter is described by equation (1). The cross-wafer model defines the variation in film thickness at any location on the semiconductor wafer. In this example, the cross-wafer model is dependent on radial position, but independent of angular position. Based on the cross-wafer model, the values of the film thickness can be linked and floated together for measurements of any combination of sites located at the same distance from the center of the wafer. For example, as illustrated in FIG. 4, wafer 101 includes a group of measurement sites 141A, 141B, 141C, and 141D that are a distance R1 from the center of wafer 101. Measurements at these sites can be simultaneously analyzed based on a measurement model linking the value of the film thickness for each of these measurements. As discussed hereinbefore, in some examples, the value may be floated. In some other examples, the value may be determined by a fitting of measurement data to the cross-wafer model for each group of measurement sites located a fixed distance from the center of the wafer. In this manner, it is expected that the film thickness associated with measurements at sites 141A, 141B, 141C, and 141D is different than measurements at sites 140A, 140B, 140C, and 140D located a distance, R2, from the center of wafer 101.

In block 203, an amount of measurement data is received. In some examples, the amount of measurement data is associated with measurements of the target structure by a metrology tool. In one example, the amount of measurement data includes measurement data 111 measured over a range of wavelengths and polarization angles by the SE metrology subsystem illustrated in FIG. 1. In another example, the measurement data could be data stored in a library.

In block 204, a second set of parameter values characterizing the target structure is determined. The second set of parameter values are determined based on a fitting of the measurement data to a second measurement model of the target structure that is constrained by the cross-wafer model. In some examples, the first measurement model is transformed to a second measurement model of the structure including a second set of parameters. The transforming of the first model to the second model is constrained by the cross-wafer model. Furthermore, the second set of parameters is different from the first set of parameters. In addition, the second set of parameters includes fewer parameters than the first set of parameters. The reduction in the number of parameters and the reduced correlation among the second set of parameters relative to the first number of parameters contributes to increased model stability and computational speed.

The cross-wafer model is used to determine a new parameterization (i.e., the second set of parameters) that minimizes parameter correlation by transformation. In general, these operations involve working with signals measured as a function of the different machine parameters (e.g., wavelength, polarization angle, state of coherence, etc.). In some examples, principal components analysis (PCA) is employed to generate the second model.

Exemplary methods and systems for model transformation are described in U.S. patent application Ser. No. 13/286, 079 assigned to KLA-Tencor Corporation, and published on May 2, 2013, under U.S. Patent Publication No. 2013/0110477 A1, the entirety of which is incorporated herein by reference.

In block 205, the second set of parameter values are stored in memory. The second set of parameter values may be stored in memory on-board metrology system 100, for example, in memory 132, or may be communicated (e.g., via output signal 140) to an external memory device.

In general, the systems and methods described herein can be implemented as part of the process of preparing an optimized measurement model for off-line or on-tool measurement. In addition, both measurement models and any reparameterized measurement model may describe one or more target structures and measurement sites.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
   providing a first amount of illumination light to a target structure disposed on a semiconductor wafer, the target structure having an unknown spectral response;
   detecting an amount of light from the target structure in response to the first amount of illumination light provided to the semiconductor wafer, the detected amount of light comprising a first amount of measurement data;
   receiving the first amount of measurement data associated with the measurements of the target structure located on the semiconductor wafer;
   determining a first set of parameter values characterizing the target structure based on a fitting of the first amount of measurement data to a first measurement model of the target structure, wherein the first measurement model is based on a second measurement model constrained by a cross-wafer model; and
   storing the first set of parameter values in a memory.

2. The method of claim 1, wherein the second measurement model of the target structure includes a second set of parameters characterizing the target structure.

3. The method of claim 2, wherein the cross-wafer model characterizes a process induced variation of at least one parameter of the second set of parameters characterizing the target structure at any location on the semiconductor wafer.

4. The method of claim 1, wherein at least one of the first set of parameter values is any of a focus parameter value, a dosage parameter value, and an overlay parameter value.

5. The method of claim 3, wherein the cross-wafer model is a parameterized model of a value of the at least one parameter as a function of location on the semiconductor wafer.

6. The method of claim 3, wherein the cross-wafer model links values of the at least one parameter value as a function of location on the semiconductor wafer.

7. The method of claim 3, wherein a value of the at least one parameter of the second set of parameters characterizing the target structure is dependent on a location of the target structure on the semiconductor wafer.

8. The method of claim 7, wherein the cross-wafer model that characterizes a process induced variation of the at least one parameter is dependent on the location of the target structure on the semiconductor wafer.

9. A system to generate an optimized measurement model, the system comprising:
   an optical metrology system including an illumination source and a detector configured to perform measurements of a target structure using a set of measurement technologies and machine parameter values; and
   a computing system configured to:
   receive a first amount of measurement data associated with measurements of the target structure;
   determine a first set of parameter values characterizing the target structure based on a fitting of the first amount of measurement data to a first measurement model of the target structure, wherein the first measurement model is based on a second measurement model constrained by a cross-wafer model; and
   store the first set of parameter values.

10. The system of claim 9, wherein the second measurement model of the target structure includes a second set of parameters characterizing the target structure.

11. The system of claim 10, wherein the cross-wafer model characterizes a process induced variation of at least one parameter of the second set of parameters characterizing the target structure at any location on the semiconductor wafer.

12. The system of claim 9, wherein at least one of the first set of parameter values is any of a focus parameter value, a dosage parameter value, and an overlay parameter value.

13. The system of claim 11, wherein the cross-wafer model is a parameterized model of a value of the at least one first parameter as a function of location on the semiconductor wafer.

14. A metrology system comprising:
   an illuminator that provides a first amount of illumination light to a target structure disposed on a semiconductor wafer, the target structure having an unknown spectral response;
   a detector that detects an amount of light from the target structure in response to the first amount of illumination light provided to the semiconductor wafer, the detected amount of light comprising a first amount of measurement data; and
   a non-transitory, computer-readable medium, comprising:
   code for causing a computer to receive the first amount of measurement data associated with measurements of the target structure;
   code for causing the computer to determine a first set of parameter values characterizing the target structure based on a fitting of the first amount of measurement data to a first measurement model of the target structure, wherein the first measurement model is based on a second measurement model constrained by a cross-wafer model; and
   code for causing the computer to store the first set of parameter values in a memory.

15. The metrology system of claim 14, wherein the second measurement model of the target structure includes a second set of parameters characterizing the target structure.

16. The metrology system of claim 15, wherein the cross-wafer model characterizes a process induced variation of at least one parameter of the second set of parameters characterizing the target structure at any location on the semiconductor wafer.

17. The metrology system of claim 14, wherein at least one of the first set of parameter values is any of a focus parameter value, a dosage parameter value, and an overlay parameter value.

18. The metrology system of claim 16, wherein the cross-wafer model is a parameterized model of a value of the at least one parameter as a function of location on the semiconductor wafer.

19. The metrology system of claim 16, wherein the cross-wafer model links values of the at least one parameter as a function of location on the semiconductor wafer.

20. The metrology system of claim 16, wherein the cross-wafer model that characterizes a process induced variation of the at least one parameter is dependent on the location of the target structure on the semiconductor wafer.

* * * * *